United States Patent
Hinks et al.

(10) Patent No.: US 6,396,268 B1
(45) Date of Patent: May 28, 2002

(54) MAGNETIC RESONANCE IMAGING DEVICE HAVING MAGNETIC FIELD DISTURBANCE COMPENSATION

(75) Inventors: Richard S. Hinks, Waukesha; Scott T. Mansell; Michael J. Radziun, both of Waterford; Dewain A. Purgill, Waukesha; Anton M. Linz, Mukwonago, all of WI (US); Darren L. Hallman, Clifton Park, NY (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/677,410

(22) Filed: Oct. 2, 2000

(51) Int. Cl.[7] .................................................. G01V 3/00
(52) U.S. Cl. ........................ 324/307; 324/309; 324/300
(58) Field of Search ................................ 324/322, 320, 324/318, 309, 307; 600/410

(56) References Cited

U.S. PATENT DOCUMENTS

| | | | | |
|---|---|---|---|---|
| 5,152,288 A | * | 10/1992 | Hoenig et al. | 128/653.1 |
| 5,302,899 A | * | 4/1994 | Schett et al. | 324/318 |
| 5,631,561 A | * | 5/1997 | Stetter | 324/322 |
| 5,731,704 A | * | 3/1998 | Schnur et al. | 324/320 |
| 5,876,337 A | * | 3/1999 | Tsuda | 600/410 |

* cited by examiner

Primary Examiner—Edward Lefkowitz
Assistant Examiner—Brij B. Shrivastav

(57) ABSTRACT

A magnetic resonance imaging device has a compensation circuit for compensating for magnetic disturbances therein. The compensation circuit includes a sensor for sensing magnetic field changes and generating a magnetic field change signal. The sensor is coupled to a control circuit that has a transfer function therein. The control circuit is used to generate a compensation signal in response to the magnetic field change signal. The compensation signal may be coupled to the compensation coils located by the first magnet portion and the second magnet portion of the device. Also, the compensation signal may produce a time-dependent bias or change the center frequency to cancel magnetic disturbances.

18 Claims, 2 Drawing Sheets

MAGNETIC RESONANCE IMAGING DEVICE HAVING MAGNETIC FIELD DISTURBANCE COMPENSATION

TECHNICAL FIELD

The present invention relates generally to magnetic resonance imaging, and more specifically, to detecting and compensating for magnetic fields disturbances in a magnetic imaging device.

BACKGROUND

In magnetic resonance imaging (MRI), the protons of an imaged body are excited into resonance by a radio frequency field applied to the imaged object in the presence of a static magnetic field. The static magnetic field may be produced by a superconducting magnet having multiple coils of superconducting wire immersed in a cryogen and energized with an electrical current. Field strengths of several Tesla may be achieved with essentially no power consumption.

The frequency of the resonance of the protons of the imaged object excited by the radio frequency field is dependent on the strength of the magnetic field and certain characteristics of the protons.

As the protons precess in resonance, separate gradient magnetic fields of substantially smaller strength than the static magnetic field are applied to the imaged body to shift the phase and frequency of the resonance of the protons in accordance with each proton's location within the imaged object. The combined signal produced by the resonating protons is then analyzed mathematically to produce an image of the imaged body along a "slice" through the imaged body.

The contribution of each resonating proton to the slice image is dependent of the phase and frequency of its resonance. If the static magnetic field is uniform, this phase and frequency will be dependent solely on the position of the protons in the gradient magnetic field. If the static magnetic field is not uniform, the apparent position of the protons, as determined by the phase and frequency of their resonance, will be shifted. This introduces artifacts or other distortions into the reconstructed image of the imaged body. The elimination of such artifacts requires that the static magnetic field used in MRI must be extremely uniform. Magnetic field homogeneities of less than a few parts per million over the imaging volume are required.

It follows that the static magnetic field also must be highly stable. The time required to collect the data for a single MRI slice image may be several minutes for certain imaging techniques. Mechanical disturbances of the magnet or magnet structures cause time-dependent changes in the magnetic field strength. Such mechanical disturbances cause magnetic field changes that may result in ghosting artifacts in MR imaging. Depending on the driving mechanical function, these disturbances may additionally result in vibration of said magnet structures resulting in oscillation of the magnetic field strength. The magnetic field changes may be spatially independent or may have additionally spatially-dependent terms such as a linear dependence on a given spatial axis or a higher order, such as a squared, dependence on a given spatial axis within the imaging volume of the magnet. Mechanical disturbances of the magnet may be caused by environmental disturbances such as building vibration or self-induced in the MRI system by pulsing of the magnetic field gradients during MR imaging.

It would therefore be desirable to improve the quality of a magnetic resonance image to reduce undesirable artifacts or distortion in the field due to varying magnetic field strength.

SUMMARY OF THE INVENTION

It is therefore one object of the present invention to determine magnetic field changes by detecting magnet structural motion or magnetic field changes and to actively cancel the magnetic field changes in the MRI device to improve the resulting image.

In one aspect of the invention, an apparatus for producing magnetic resonance images includes a first magnet portion and a sensor positioned at a pre-determined relationship with respect to the first magnet portion. The sensor generates a magnetic field change signal indicative of a magnetic field change generated at the first magnet portion. A control circuit is coupled to the sensor and generates a compensation signal in response to the magnetic field change signal. The compensation signal is used to actively cancel changes in the magnetic field.

In another aspect of the invention, an electromagnetic compensation coil may be used to receive the compensation signal to generate active canceling of the changed magnetic field. In yet another aspect of the invention, the compensation signal may be coupled to a transceiver circuit to change the center frequency of the transceiver circuit and therefore compensate the effect of magnetic field changes.

In yet another aspect of the invention, a method for compensating for magnetic field disturbances in a magnetic resonance imaging device having a first magnet portion comprising the steps of:

generating a magnetic field change signal indicative of a change in the magnetic field;

determining the compensation signal in response to the magnetic field change signal; and actively canceling the change in the magnetic field in response to the compensation signal.

One advantage of the invention is that various types of sensors may be incorporated into the system in a redundant manner.

Other objects and features of the present invention will become apparent when viewed in light of the detailed description of the preferred embodiment when taken in conjunction with the attached drawings and appended claims.

DETAILED DESCRIPTION OF THE PREFERRED EMBODIMENT

Figure 1:
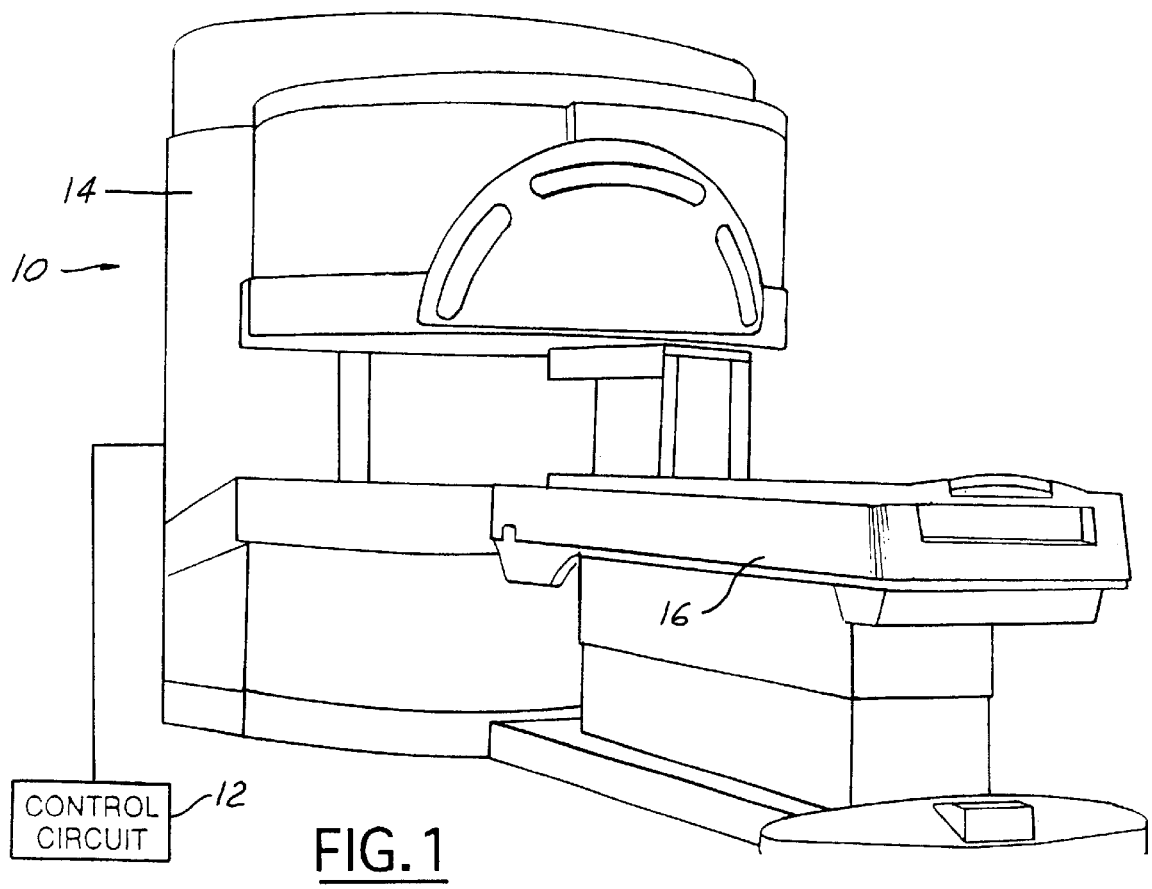
FIG. 1 is a perspective view of a magnetic resonance imaging device having a compensation circuit according to the present invention.

In the following figures, the same reference numerals we use to identify the same components in the various views. Although various embodiments and alternatives are presented, those skilled in the art will recognize various other alternatives without varying from the true scope and spirit of the invention.

Referring now to FIG. 1, a magnetic resonance imaging device 10 is illustrated having a control circuit 12. Control circuit 12 controls various functions of the MRI device. As will be further described below, a housing 14 houses the magnetic structure to create an image volume for patients moved into the image volume upon support structures 16.

Figure 2:
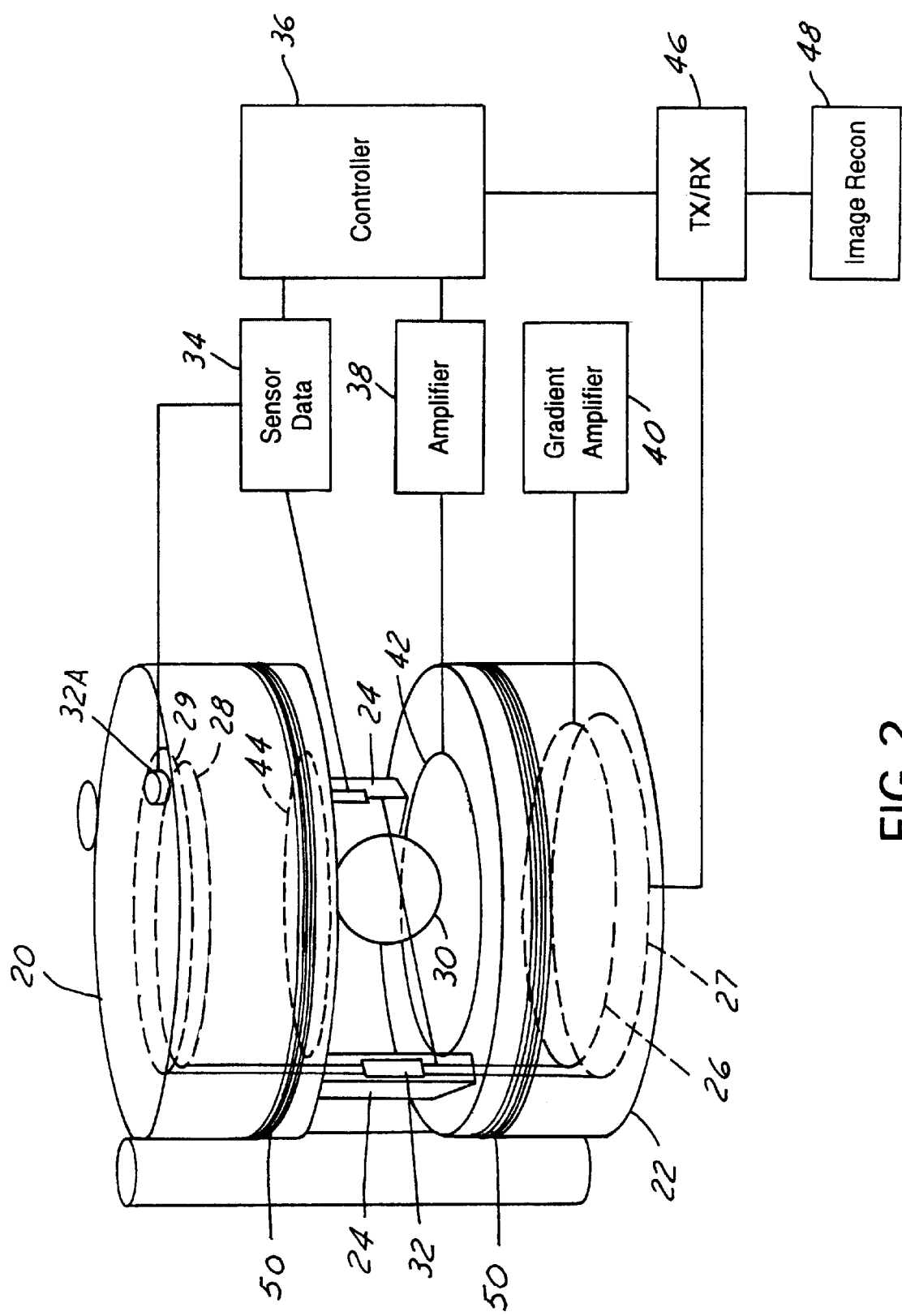
FIG. 2 is a high level block diagrammatic view of a magnetic resonance imaging device having a compensation circuit according to the present invention.

Referring now to FIG. 2, a simplified block diagrammatic view of magnetic resonance imaging device 10 and control circuit 12 is illustrated. Generally, MRI device 10 has a magnet top half 20, a magnet bottom half 22 and a support post 24 for holding magnet top half 20 a pre-determined distance from magnet bottom half 22. The magnet top half 20 is series connected with magnet bottom half 22 and thus form one magnet. Generally, magnet top half 20 and magnet bottom half 22 have a respective imaging gradient coil 26, 28 and RF coils 27, 29. Magnet top half 20 and magnet bottom half 22 have an imaging volume 30 therebetween. Imaging volume 30 includes the position of the patient to be imaged as well as an area surrounding the magnet top half 20 and magnet bottom half 22 that is effected by the magnetic field. Due to various mechanical disturbances, a relative position change of the magnet top half 20 and magnet bottom half 22 may cause ghosting or other undesirable imaging effects.

Control circuit 12 has been added to provide compensation for magnetic field changes due to mechanical disturbances. Control circuit 12 includes a sensor 32 that may be positioned on support post 24. Of course, various other locations for sensor 32 may be evident to those skilled in the art such as position 32A on magnet top half 20. Sensor 32 may include, but is not limited to, a piezo-electric sensor, an accelerometer, a fiberoptic strain gauge, a microwave interferometer, a laser interferometer, an ultra-sonic transducer or a pressure transducer. Also, those skilled in the art will recognize that more than one sensor 32 may be employed. If more than one sensor is employed, the sensors may be placed in different locations as well as being of different types. Sensor 32 generates a magnetic field change signal that is represented by sensor data block 34. The magnetic field change signal may measure the magnetic field change directly or infer the magnetic field change by sensing strain or movement of the support post or other mechanical structure. Sensor data block 34 is coupled to a controller 36.

Controller 36 may be one of the variety of types of controllers including a micro-processor based controller, such as a PID controller, a digital filter or an auto-regressive moving average (ARMA) device, or an analog circuit. Controller 36 may be stand-alone for the compensation circuit or may be incorporated into the MR system controller. Depending upon the type of sensor data from the sensor, an analog-to-digital converter and/or digital signal processing such as filtering may be required as it would be known to those skilled in the art. Controller 36 has a transfer function residing therein. This transfer function is preferably predetermined and is used to process the sensor data 34 and convert the sensor data 34 into a compensation signal. A compensation signal 34 may have many forms depending on the type of compensation desired. In a first embodiment of the present invention, the compensation signal is provided to an amplifier 38 which in turn is coupled to compensation coils 42,44 to compensate for magnetic field changes caused by relative magnetic motion in response to the compensation signal. Controller 36 is coupled to a gradient coil 26 and a second gradient coil 28. Gradient coils 26, 28 are preferably electromagnetic coils that may be driven to generate a magnetic field.

In operation of the first embodiment of the invention, the controller 36 through the predetermined transfer function converts sensor signal that is indicative of a magnetic field change into a compensation signal that is used to drive the compensation coils and minimize change in the magnetic field due to the relative movement of magnet top half 20 and magnet bottom half 22 or due to relative motion of components within a single magnet half. The magnetic field of the compensation coils actively cancels the magnetic interference.

In another embodiment of the invention, a transceiver circuit 46 is commonly included in a magnetic resonance imaging device 10. Transceiver circuit may include an RF amplifier and transmit/receive switch known to those skilled in the art. Transceiver 46 transmits a control signal to RF coils 27, 29. Transceiver 46 receives image information and generates an image at image reconstruction circuit 48. The transmitted signal is typically an RF signal having a center frequency.

However, the controller 36 may be used to generate a compensation signal that changes the transceiver center frequency to compensate magnetic-field changes due to relative mechanical movement of the magnetic top half 20 and the magnet bottom half 22 or movement of the components within top half 20 and bottom half 22.

In the third alternative embodiment, the controller 36 may be used to generate a compensation signal that has a time dependent bias added to the driving signal of the gradient coils 26, 28 through gradient amplifier 40. In a similar manner to the second embodiment above, the compensation circuit based on the time-dependent bias, will allow the imaging gradient coils 26, 28 to cancel magnetic field changes due to mechanical movement of magnet top half 20 and magnet bottom half 22.

In a fourth embodiment of the invention, a magnet field sensor 50 may be incorporated outside 25 the imaging volume 30. By locating the sensor 50 outside imaging volume, direct detection of the magnetic field changes introduced by the pulsing of the magnetic field gradients during imaging are minimized. The magnetic field sensor 50 generates a signal that may be used in place of sensor 32 or in combination with sensor 32. A transfer function may be programmed into controller 36 to provide a compensation signal using the magnetic field sensor 50. Magnetic field sensor 50 may be one of a various number of types of magnetic field sensors known to those skilled in the art. One example of a suitable magnetic field sensor 50 is an inductive coil that partially or entirely surrounds the magnet top half 20 and magnet bottom half 22.

It should be noted that to provide the most effective magnetic field cancellation, two or all of the methods described above may be combined.

Figure 3:
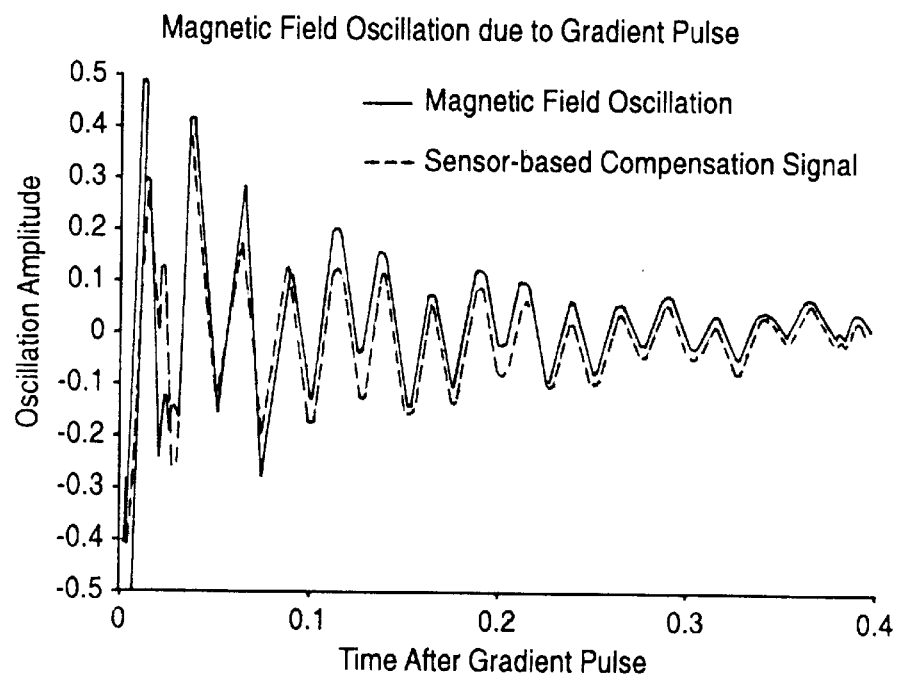
FIG. 3 is a plot of a compensation circuit output versus magnetic field isolation of a constructed embodiment of the present invention.

Referring now to FIG. 3, a plot of oscillation amplitude versus time after a gradient pulse is illustrated for magnetic field oscillation in contrast to a sensor-based compensation signal according to the present invention. As is shown, the sensor based compensation signal according to the present invention may be used to nearly cancel the effects of the magnetic field oscillation after inverting the signal or subtracting the signal from the magnetic field oscillation.

In operation, a transfer function for a particular sensor and magnetic resonance imaging device may be experimentally determined for the particular MRI device configuration. The transfer function takes into account the specific magnetic geometry, the sensors used and the location of the sensors. The change in the magnetic field is sensed either directly or indirectly and transfer function is used to generate a compensation signal in response to the magnetic field change signal. The magnetic field changes are actively cancelled or compensated in response to the compensation signal.

While particular embodiments of the invention have been shown and described, numerous variations and alternate embodiments will occur to those skilled in the art. Accordingly, it is intended that the invention be limited only in terms of the appended claims.

What is claimed is:

1. An apparatus for producing magnetic resonance images comprising:
   a first magnet portion;
   a sensor generating a magnetic field change signal indicative of a magnetic field change of said first magnet portion;
   a control circuit coupled to said sensor for generating a compensation signal in response to said magnetic field change signal to compensate for said magnetic field change; and
   a transceiver circuit coupled to said controller;
   wherein said compensation signal changes a center frequency of said transceiver circuit.

2. An apparatus for producing magnetic resonance images comprising:
   a first magnet portion;
   a sensor generating a magnetic field change signal indicative of a magnetic field change of said first magnet portion;
   a control circuit coupled to said sensor for generating a compensation signal in response to said magnetic field change signal to compensate for said magnetic field change; and
   a first compensation coil coupled to said controller and positioned adjacent said first magnet portion, said first compensation coil generating a magnetic field in response to the compensation signal to compensate for the magnetic field change.

3. An apparatus as recited in claim 2 further comprising an amplifier circuit coupled between said first compensation coil and said control circuit.

4. An apparatus as recited in claim 2 further comprising a second magnet portion spaced a pre-determined distance apart from and coupled to the first magnet portion.

5. An apparatus as recited in claim 4 further comprising a second compensation coil positioned adjacent said second magnet portion, said second compensation coil receiving said compensation signal.

6. An apparatus as recited in claim 5 further comprising a support post coupled between said first magnet portion and said second magnet portion, said sensor coupled to said support post.

7. An apparatus for producing magnetic resonance images comprising:
   a first magnet portion comprising an imaging gradient coil;
   a sensor generating a magnetic field change signal indicative of a magnetic field change of said first magnet portion; and
   a control circuit coupled to said sensor for generating a compensation signal in response to said magnetic field change signal to compensate for said magnetic field change, said controller coupled to said imaging gradient coil, said compensation signal comprising a time-dependent bias signal for said gradient coil.

8. An apparatus for producing magnetic resonance images comprising:
   a first magnet portion;
   a sensor generating a magnetic field change signal indicative of a magnetic field change of said first magnet portion; and
   a control circuit coupled to said sensor for generating a compensation signal in response to said magnetic field change signal to compensate for said magnetic field change;
   wherein said sensor is selected from the group consisting of a piezo-electric sensor, an accelerometer, a fiberoptic strain gauge, a microwave interferometer, a laser interferometer, an ultra-sonic transducer and a pressure transducer.

9. An apparatus for producing magnetic resonance images comprising:
   a first magnet portion;
   a sensor generating a magnetic field change signal indicative of a magnetic field change of said first magnet portion; and
   a control circuit coupled to said sensor for generating a compensation signal in response to said magnetic field change signal to compensate for said magnetic field change,
   said controller having a transfer function therein, said controller generating said compensation signal in response to said transfer function and said magnetic field change signal.

10. An apparatus as recited in claim 4 wherein said sensor comprises a magnetic field sensor, said first magnet portion and said second magnet portion defining an imaging volume, said magnetic field sensor positioned outside said imaging volume.

11. An apparatus for producing magnetic resonance images comprising:
    a first magnet portion;
    a second magnet portion spaced a pre-determined distance from the first magnet portion;
    a sensor generating a magnetic field change signal indicative of a magnetic field change;
    a first compensation coil positioned adjacent said first magnet portion;
    a control circuit coupled to said sensor for generating a compensation signal in response to said magnetic field change signal; and
    a second compensation coil positioned adjacent said second magnet portion, said second compensation coil receiving said compensation signal.

12. An apparatus for producing magnetic resonance images comprising:
    a first magnet portion;
    a second magnet portion spaced a pre-determined distance from the first magnet portion;
    a sensor generating a magnetic field change signal indicative of a magnetic field change;
    a first compensation coil positioned adjacent said first magnet portion; and
    a control circuit coupled to said sensor for generating a compensation signal in response to said magnetic field change signal;
    said sensor being selected from the group consisting of a piezoelectric sensor, an accelerometer, a fiberoptic strain gauge, a microwave interferometer, a laser interferometer, an ultra-sonic transducer and a pressure transducer.

13. An apparatus for producing magnetic resonance images comprising:
    a first magnet portion;
    a second magnet portion spaced a pre-determined distance from the first magnet portion;

a sensor generating a magnetic field change signal indicative of a magnetic field change;

a first compensation coil positioned adjacent said first magnet portion; and a control circuit coupled to said sensor for generating a compensation signal in response to said magnetic field change signal, said control circuit having a transfer function therein, said control circuit generating said compensation signal in response to said transfer function and said magnetic field change signal.

14. An apparatus for producing magnetic resonance images comprising:

a first magnet portion;

a second magnet portion spaced a pre-determined distance from the first magnet portion;

a sensor generating a magnetic field change signal indicative of a magnetic field change;

a first compensation coil positioned adjacent said first magnet portion; and a control circuit coupled to said sensor for generating a compensation signal in response to said magnetic field change signal, said sensor comprising a magnetic field sensor, said first magnet portion and said second magnet portion defining an imaging volume, said magnetic field sensor positioned outside said imaging volume.

15. A method for compensating magnetic field disturbances in a magnetic resonance image device having a first magnet portion comprising the steps of:

generating a magnetic field change signal indicative of a change in a magnetic field of the first magnet portion;

determining the compensation signal in response to the magnetic field change signal by generating a transfer function and generating said compensation signal as a function of said transfer function and said magnetic field change signal; and actively compensating the change in the magnetic field in response to the compensation signal.

16. A method for compensating magnetic field disturbances in a magnetic resonance image device having a first magnet portion comprising the steps of:

generating a magnetic field change signal indicative of a change in a magnetic field of the first magnet portion;

determining the compensation signal in response to the magnetic field change signal; and actively compensating the change in the magnetic field in response to the compensation signal by generating a magnetic field at a compensation coil.

17. A method for compensating magnetic field disturbances in a magnetic resonance image device having a first magnet portion comprising the steps of:

generating a magnetic field change signal indicative of a change in a magnetic field of the first magnet portion;

determining the compensation signal in response to the magnetic field change signal by generating a compensation signal having a shifted center frequency; and actively compensating the change in the magnetic field in response to the compensation signal.

18. A method for compensating magnetic field disturbances in a magnetic resonance image device having a first magnet portion comprising the steps of:

generating a magnetic field change signal indicative of a change in a magnetic field of the first magnet portion;

determining the compensation signal in response to the magnetic field change signal by generating a compensation signal having a time-dependent bias; and actively compensating the change in the magnetic field in response to the compensation signal.

* * * * *